US008604865B2

(12) United States Patent
Pillin et al.

(10) Patent No.: US 8,604,865 B2
(45) Date of Patent: Dec. 10, 2013

(54) TRANSPONDER WITH A MODULATOR

(75) Inventors: Nicolas Pillin, St-Sulpice (CH); David A. Kamp, Monument, CO (US)

(73) Assignee: EM Microelectronic-Marin S.A., Marin (CH)

( * ) Notice: Subject to any disclaimer, the term of this patent is extended or adjusted under 35 U.S.C. 154(b) by 0 days.

(21) Appl. No.: 13/478,485

(22) Filed: May 23, 2012

(65) Prior Publication Data

US 2012/0299641 A1 Nov. 29, 2012

(30) Foreign Application Priority Data

May 27, 2011 (EP) ..................................... 11167941

(51) Int. Cl.
 *H03K 17/687* (2006.01)
(52) U.S. Cl.
 USPC .......................................... 327/427; 327/434
(58) Field of Classification Search
 USPC ......... 327/534, 530, 535, 536, 537, 538, 540, 327/541, 543, 545, 546, 566, 574, 594, 595, 327/108, 309, 318, 323, 325, 327, 328, 331, 327/332, 427, 434; 342/30, 42, 513
 See application file for complete search history.

(56) References Cited

U.S. PATENT DOCUMENTS

| 5,825,214 | A | * | 10/1998 | Klosa | ........................... | 327/104 |
| 5,889,489 | A | * | 3/1999 | Friedman et al. | ............... | 342/51 |
| 7,944,279 | B1 | * | 5/2011 | El Waffaoui | .................. | 327/536 |
| 2008/0185627 | A1 | | 8/2008 | Horch | | |
| 2008/0186772 | A1 | | 8/2008 | Horch | | |
| 2012/0049937 | A1 | * | 3/2012 | El Waffaoui | .................. | 327/536 |
| 2012/0119822 | A1 | * | 5/2012 | Bas et al. | ....................... | 327/536 |

FOREIGN PATENT DOCUMENTS

GB 2 307 364 A 5/1997

OTHER PUBLICATIONS

"6.2 The well controversy in CMOS", In: Stanley Wolf: "Silicon Processing for the VLSI era", CMOS Process Integration, XP-002671206, vol. 2, Dec. 31, 1990, pp. 381-384.
Michael Quirk, et al., : "Semiconductor manufacturing technology", Device Technologies, Dec. 31, 2001, XP002671207, pp. 53-59.
European Search Report issued Mar. 9, 2012, in European Patent Application No. 11167941.1, filed May 27, 2011.

* cited by examiner

*Primary Examiner* — Lincoln Donovan
*Assistant Examiner* — Jung H. Kim
(74) *Attorney, Agent, or Firm* — Oblon, Spivak, McClelland, Maier & Neustadt, L.L.P.

(57) ABSTRACT

A RFID transponder includes an electronic circuit and an antenna, the electronic circuit being integrated in a p-type substrate and comprising a modulator formed by a PMOS transistor whose drain, electrically connected to a pad of the antenna, and source, connected to the ground of the electronic circuit, are arranged in an n-type well provided in the p-type substrate. The PMOS transistor has a gate driven by a driving circuit which is arranged for providing at least a negative voltage, this negative voltage being low enough for turning on this PMOS transistor in response to a control signal provided by a logical unit of the electronic circuit.

5 Claims, 3 Drawing Sheets

TRANSPONDER WITH A MODULATOR

This application claims priority from European Patent Application No. 11167941.1 filed 27 May, 2011, the entire disclosure of which is incorporated herein by reference.

FIELD OF THE INVENTION

The invention concerns the domain of RFID transponders or tags which have an electronic circuit connected to an antenna, the electronic circuit comprising a modulator used to generate modulated signals which can be received by a reader.

BACKGROUND OF THE INVENTION

FIG. 1 shows a UHF transponder with its general architecture. The transponder 2 has an electronic circuit 4 and an antenna 6. The UHF antenna is formed by two branches connected by a stub inductor (DC short). The electronic circuit has a rectifier 8 providing a positive voltage Vdd for supplying this electronic circuit. It is to be noted that the transponder can have a battery instead of the rectifier or both. The electronic circuit further comprises a memory and a logic circuit 10, a demodulator 12 for demodulating signals received from a determined reader and a modulator 14 used to generate signals for the reader.

The antenna has a first pad 16 connected to the ground Gnd of the electronic circuit which corresponds to the low voltage Vss of this circuit. The second pad 18 of the antenna is connected in particular to the modulator 14. This modulator is also generally connected to the ground Gnd.

FIGS. 2A and 2B shows a classical modulator incorporated in a transponder or tag of the type represented in FIG. 1. This modulator is formed by a NMOS transistor 22 having its source 24 and its substrate 26 connected to Vss (Gnd). The drain 28 of the transistor 22 is connected to a terminal 'Ant' of the modulator which is connected to the pad 18 of the antenna 6. In some applications, a series capacitor is placed between the transistor's drain and the antenna pad. The NMOS transistor has also a gate 30 which received a control signal Vg whose value ('High' or 'Low') depends from the logic signal Tx ('1' or '0') provided to the modulator 14 by the logic circuit 10 (FIG. 1). The NMOS transistor is selected because it turns on ('ON') when Vg is High and preferably approximately to Vdd and it turns off ('OFF') when Vg is Low and preferably approximately to Gnd. Thus, it is easy to switch the NMOS transistor with the available voltage range in the electronic circuit (Vss=Gnd to Vdd which is generally positive, e.g. +3V). The modulator performs e.g. ASK and/or PSK on the RF signal backscattered by the tag/transponder.

Such a classical design has in fact a major drawback because the alternative signal received on the antenna 6 has positive and negative swings. The negative swing can give rise to a functional problem for the transponder. Indeed, in NMOS modulators a parasitic diode 20 exists between the n-type drain 28 and the p-type substrate 26 (the p-part of the parasitic diode 20 in the substrate is represented by a dotted line). In high field conditions, the negative swing on the antenna pad can be large enough to turn this parasitic diode on. This results in the injection of electrons from the n-type drain region into the p-type substrate. Electrons become minority carriers when injected in the p-substrate. Thus, they can travel over distances of several tens of micrometers or more before being finally collected by an n-type region. When collected in sensitive circuits (voltage/current references, amplifiers, etc. . . . ), these carriers modify the behavior of these sensitive circuits and can even kill their functionality.

Consequently, the dynamic range (i.e. maximum power that the tag can sustain on its antenna pad 18 while still operating normally) is limited to the point where minority carrier injection starts.

A solution to the above mentioned problem is to rely on a process that offers deep n-well or triple well. This allows isolating the NMOS modulator from the rest of the electronic circuit and stopping the propagation of minority carriers. However, such a technology causes additional costs (masks, fabrication steps . . . ), which have direct repercussions on the final price per tag.

General information about MOSFETs and the CMOS technology can respectively be found e.g. in the book of Michael Quirk & Julian Serda, entitled "Semiconductor manufacturing technology", 2001 Dec. 31, Prentice Hall, Upper Saddle River N.J. USA, pages 53-59, (ISBN:0130815209); and in the article "6.2 The well controversy in CMOS" In: Stanley Wolf: "Silicon Processing for the VLSI era", 1990 Dec. 31, Lattice Press, Sunset Beach Calif. USA, vol. 2, pages 381-384.

The aim of the present invention is to overcome the above mentioned problem without having to use a more complicated technology that increases the price of the electronic circuit, but by using a technology corresponding to the standard CMOS technology.

SUMMARY OF THE INVENTION

The present invention concerns a transponder comprising an electronic circuit and an antenna, the electronic circuit being integrated in a p-type substrate and comprising a modulator having a first terminal electrically connected to a pad of the antenna and a second terminal connected to the ground of the electronic circuit, wherein this modulator is formed by a PMOS transistor whose drain and source, respectively defining said first and second terminals, are arranged in an n-type well provided in said p-type substrate, wherein said PMOS transistor has a gate driven by a driving circuit which is arranged for providing at least a negative voltage, this negative voltage being low enough for turning on this PMOS transistor in response to a control signal provided by a logical unit of the electronic circuit in order to modulate.

Thus, for an electronic circuit integrated in a p-type substrate, the present invention selects a PMOS transistor instead of a NMOS transistor for the modulator. The invention by doing so prevents electron injection into the substrate.

In a particular variant, the power supply of the electronic circuit generates a positive voltage Vdd, the driving circuit comprising an inverter followed by a high-pass filter formed by a series capacitor, connected to the gate of the PMOS transistor, and a diode connected between this gate and the ground, this driving circuit further comprising a current source arranged between the positive voltage and the diode together with a switch controlled so that it turns off when the modulator is turned on.

In a preferred embodiment, the driving circuit further comprises an Anti-Negative Drift circuit (AND-circuit) arranged for verifying if the voltage Vg at said gate of the PMOS transistor is above the ground level (Gnd=Vss) after a modulation cycle and, in the contrary case, for pulling the gate voltage Vg at least to this ground level before a next modulation cycle.

The present invention also concerns the inverse technical solution wherein the electronic circuit is integrated in a n-type substrate, in which case the modulator is a NMOS transistor whose drain and source are arranged in a p-well.

BRIEF DESCRIPTION OF THE DRAWINGS

The present invention will be described subsequently in more detail with reference to the attached drawing, given by way of examples, but in no way limited thereto, in which.

DETAILED DESCRIPTION OF THE INVENTION

Figure 3A:
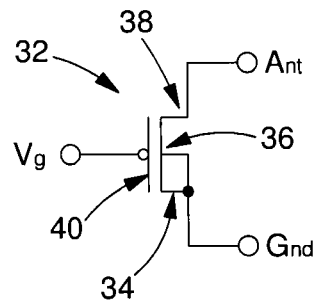
FIGS. 3A and 3B represent a PMOS modulator according to the present invention.
Figure 3B:
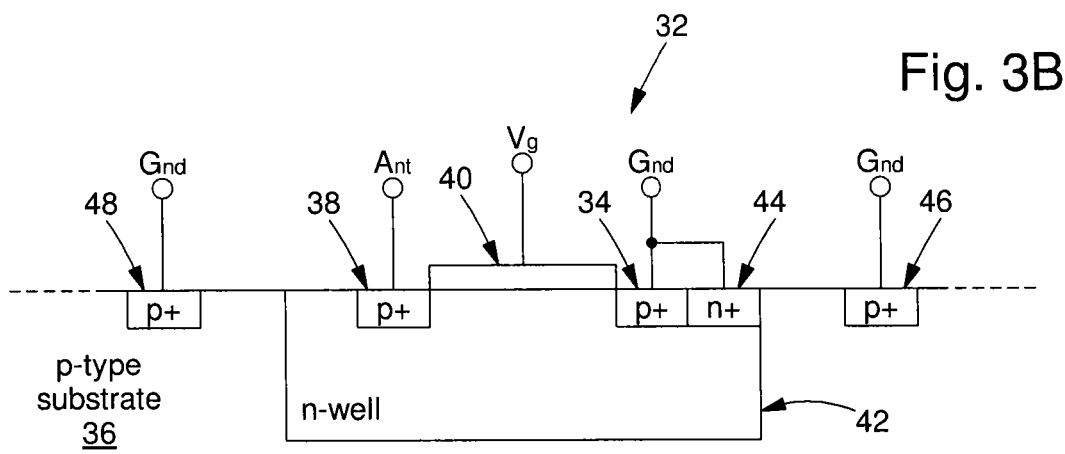

FIG. 3A is a schematic representation of a PMOS modulator 32 according to the present invention and FIG. 3B schematically shows the integration of this PMOS modulator in p-type substrate with its direct environment. The modulator 32 is formed by a PMOS transistor having its source 34 connected to the ground terminal of the electronic circuit of the transponder and its drain 38 connected to the antenna pad 'Ant', as in the prior art. The gate 40 of the transistor 32 is controlled through a voltage signal Vg. As implemented in the CMOS technology, the transistor 32 is integrated in a p-type substrate 36, its drain 38 being arranged in an n-well 42 provided in this p-type substrate. For the invention, the drain is the critical element because its potential varies relative to the potential of the p-substrate and of the n-well, the source 34 being connected to the ground and thus having the same potential as the n-well and more generally as the substrate. However, the source 34 is also integrated in the n-well so that the channel of the transistor is within a same type zone. The n-well is connected to ground through a contact zone 44 and the p-type substrate is connected to ground through further contact zones 46 and 48.

In the embodiment of the invention described here above, there is still a parasitic diode between the p-type drain 38 of the PMOS transistor 32 and the n-well 42. In high field conditions, the positive swing on the antenna pad 'Ant' can be large enough to turn this parasitic diode on. This results in the injection of holes into the n-well which diffuse in this n-well. However, by doing so, some of these holes flow to ground through contact zone 44 and others finally flow down to the p-type substrate. Holes injected in the substrate are majority carriers and are thus efficiently collected through contact zones like 46 and 48 arranged in the direct neighborhood of the n-well. There is no injection of minority carriers into the substrate as this is the case in the prior art where NMOS modulators are used.

It is to be noted that the selection of a PMOS modulator is not obvious for a person skilled in the art because the source of the modulator has to be connected to the ground (Vss) of the electronic circuit 8. To the contrary, in the standard CMOS technology, PMOS transistors have their source connected to the positive high voltage Vdd. High voltage and low voltage mean the highest voltage and lowest voltage, respectively, that is available within the electronic circuit in which the modulator is integrated. With the source at Vdd, it is possible to control the PMOS transistor with the available voltage range from Gnd/Vss to Vdd because when the gate voltage Vg is at Vss, Vg is thus negative relative to the source voltage at Vdd. However, in the present case, the source of the modulator transistor is connected to the ground Gnd of the electronic circuit. A person skilled in the art would recognize that the typical case is the implementation of a NMOS transistor with a grounded source in a p-type substrate. This is why the modulator of presently manufactured RFID transponders is a NMOS modulator.

Figure 1:
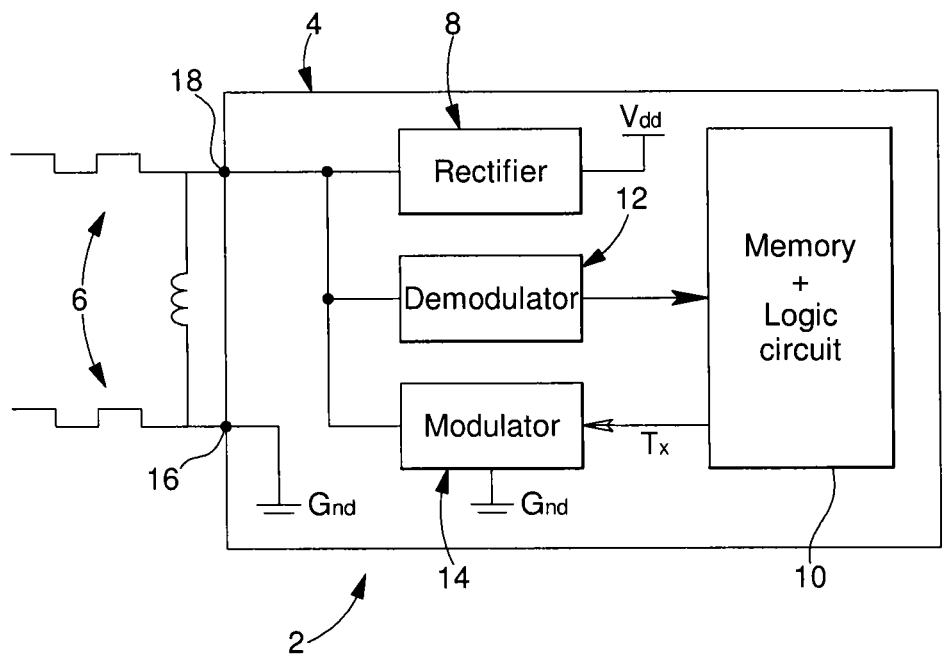
FIG. 1, already described, shows the general architecture of an UHF RFID transponder.
Figure 2A:
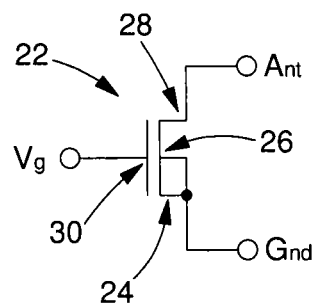
FIGS. 2A and 2B, already described, represent a NMOS modulator of the prior art.
Figure 2B:
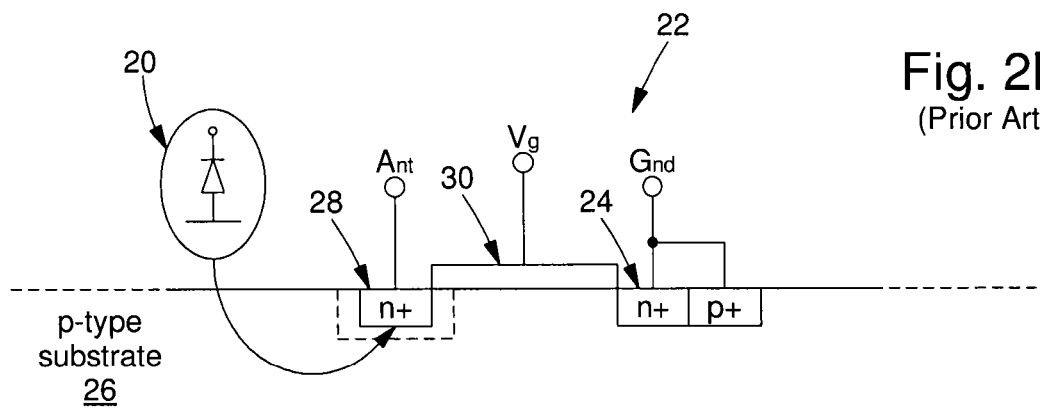

In the case of the present invention, the PMOS modulator thus needs a special driving circuit to operate. "Tx" is the logic signal that controls the state of the modulator (see FIG. 1). With an NMOS modulator, this signal can be directly connected to its gate (Tx='1'=>Vg=Vdd and the transistor conducts/Tx='0'=>Vg=Vss and the transistor does not conduct). This is not the case with the PMOS modulator 32 of the present invention. According to the present invention, the PMOS transistor has its gate 40 driven by a driving circuit which is arranged for providing at least a negative voltage, this negative voltage being low enough for turning on this PMOS transistor in response to a control signal "Tx" provided by a logical unit of the electronic circuit in order to modulate.

Figure 4:
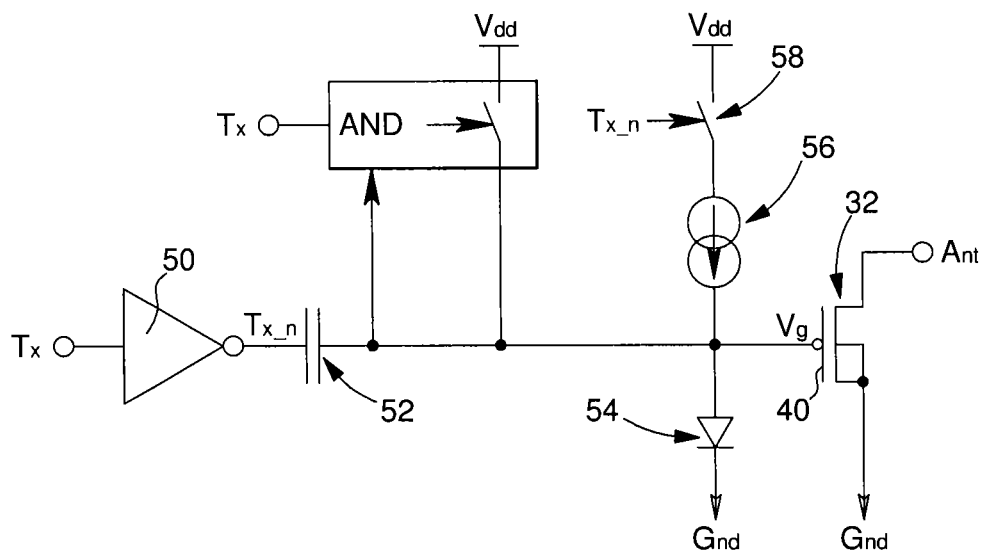
FIG. 4 is a variant of the driving circuit of the PMOS modulator according to the present invention.

A preferred embodiment of the driving circuit of the PMOS modulator according to the present invention is shown in FIG. 4. The signal Tx first needs to be inverted to the signal Tx_n with the inverter 50. A high-pass filter formed by the series capacitor 52 and the parallel diode 54 acts like a level shifter on the signal Tx_n. When Tx_n is High (i.e. Tx='0' and the modulator must not modulate), the Vg node is clamped to a small positive voltage Vg0 (given by the current source 56) and the PMOS transistor is OFF. When Tx_n goes rapidly Low (i.e. Tx='1' and the modulator must modulate), the gate voltage Vg follows because such a rapid voltage transition is transmitted through the series capacitor 52. Thus, Vg goes negative, turning on the PMOS transistor (PMOS transistor is ON). When Tx_n goes back to High (rapid transition), the gate voltage Vg is normally forced back to Vg0. The PMOS transistor is then OFF again and the driving circuit is ready for a new modulation cycle.

According to a particular variant of the driving circuit, the diode 54 is biased with a current source 56. This allows reducing the differential resistance of the diode and provides a better control on the clamping voltage Vg0. This clamping voltage Vg0 corresponds to a predetermined high value for the gate voltage Vg where the PMOS transistor is in its OFF-state. Thus, this particular variant allows to have well defined voltages for the voltage signals applied to the gate of the PMOS modulator and corresponding to the two logic signals provided by the logic circuit of the transponder. During modulation, this biasing current is unwanted because it slowly recharges the series capacitor 52 and pulls Vg toward Vg0, which degrades the modulation index. For this reason, the current source is switched off during modulation by the switch 58 controlled with the signal Tx_n.

At the end of a modulation, if, for any reason, the Vg node is forced higher than Vg0, the excess charges are quickly evacuated by the diode. If, however, the gate voltage Vg remains negative after modulation, the recharging process relies completely on the current source 56. This can be a slow process, and the PMOS modulator might not be ready before the next modulation cycle. To prevent this, an Anti-Negative Drift (AND) circuit monitors the node Vg. After each modulation, the AND circuit verifies that Vg is back to a voltage at least close to Vg0 and preferably equal to Vg0. If it is not the case, the AND circuit drives the node Vg to a higher voltage through a low impedance path, quickly recharging the series capacitor until Vg is close enough to Vg0. A variant of this AND circuit is given in FIG. 5.

Figure 5:
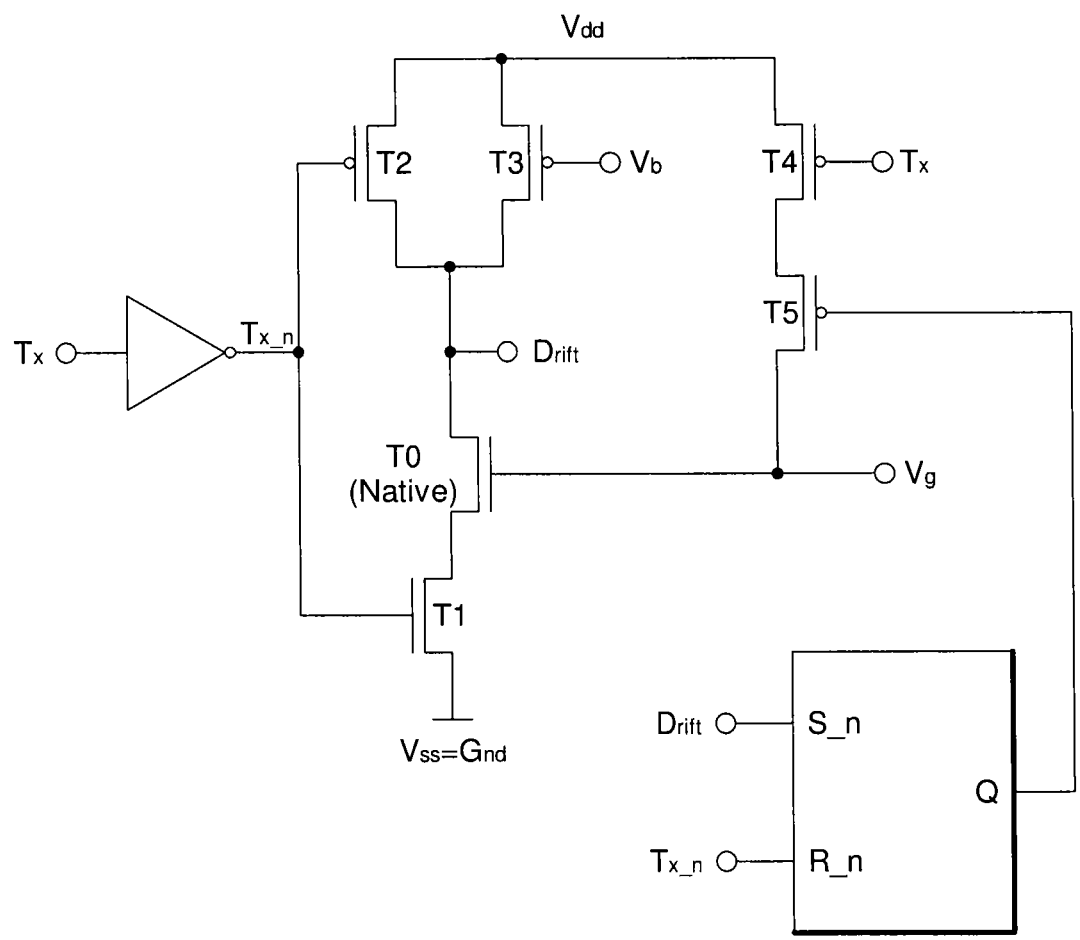
FIG. 5 shows a specific circuit of a preferred embodiment of the driving circuit, this specific circuit having an anti-negative drift function.

The aim of the "Anti-Negative Drift" (AND) circuit shown in FIG. 5 is to prevent the node Vg from remaining lower than Vss (Gnd) after a modulation. Such a situation might happen when, for example, the node Vg is forced down by fast perturbations on the "Ant" input that are transferred to the gate voltage Vg by capacitive coupling. If the node Vg is lower than Vss after modulation, it is pulled back to Vss by the current source, which provides a very weak current in order to save power. Therefore, the recharge of the node Vg is very slow and the modulator remains partially ON, at least for a certain time period, when the logic signal Tx goes back to '0' for stopping modulation. At least two problems result from this situation. The first one concerns the communication timing which is corrupted because the state of the modulator does not follow the logic signal Tx. The second problem is that during normally OFF periods of the modulator, the antenna generally supplies the rectifier of the electronic circuit in order to recharge the supply capacitor of this electronic circuit. However, if the modulator remains partially ON, it is conducting thus preventing a full power transfer from the antenna to the rectifier. The AND circuit solves these problems, as explained below.

The operation of the AND circuit present two distinct phases. In the first phase (Phase 1), Tx is LOW (no modulation/Tx='0'), T2 is OFF and the transistor T1 is ON. T0 is a native transistor and has a threshold voltage close to Vss. T0 operates as a common source amplifier loaded with the current source T3 whose gate is biased at a constant voltage Vb. At the beginning of phase 1, the RS latch ('0' active type) is reset, i.e. its output Q is LOW, and consequently the node Vg is pulled to Vdd through T4 and T5 which are both ON. If the node Vg is larger or equal to Vss, as it should be in normal operation, T0 is ON, "Drift" is LOW and the RS latch is immediately set, i.e. "Q" goes HIGH and then the transistor T5 switches OFF. Thus, the system reaches equilibrium and the AND circuit is deactivated until the next cycle.

Now, if for some reason the node Vg is lower than Vss, T4 and T5 rapidly pull Vg toward Vdd until Vg is around Vss by recharging said series capacitor. When Vg reaches the voltage Vss, T0 turns ON and Vg thus remains near Vss (between Vss and Vg0). The modulator thus quickly recovers from situation where the node Vg is lower than Vss after modulation.

In the second phase (Phase 2) of the operation of the AND circuit, the logic signal Tx is high, the node Vg goes negative and the PMOS transistor starts modulating. Tx_n is LOW and the RS latch is reset. Thus, T5 is ON but T4 is OFF so that Vg is not pulled toward Vdd. T1 is OFF and "Drift" is not tied to Vss anymore. In the absence of T2, this node would be slowly pulled toward Vdd by current source T3. It is important to quickly force "Drift" to LOW at the beginning of Phase 2 to prevent having both inputs of the RS latch to "0" at the same time (forbidden state). This is the function of the transistor T2, which is ON in Phase 2.

It is to be noted that the present invention can similarly be implemented in a n-type substrate, in which case the modulator is a NMOS transistor whose drain and source are arranged in a p-well. This corresponds to the inverse technical solution also covered by the present invention. Thus, the invention also cover a transponder comprising an electronic circuit and an antenna, the electronic circuit being integrated in a n-type substrate and comprising a modulator which has a first terminal electrically connected to a pad of the antenna and a second terminal connected to the ground (Gnd) of the electronic circuit, wherein said modulator is formed by a NMOS transistor whose drain and source, respectively defining said first and second terminals, are arranged in an p-type well provided in said n-type substrate, and wherein said NMOS transistor has a gate driven by a driving circuit which is arranged for providing at least a positive voltage, this positive voltage being high enough for turning on this NMOS transistor in response to a control signal provided by a logical unit of the electronic circuit in order to modulate.

What is claimed is:

1. A transponder comprising an electronic circuit and an antenna, the electronic circuit being integrated in a p-type substrate (36) and comprising a modulator which has a first terminal electrically connected to a pad of the antenna and a second terminal connected to the ground of the electronic circuit, wherein said modulator is formed by a PMOS transistor whose drain and source, respectively defining said first and second terminals, are arranged in an n-type well provided in said p-type substrate, and wherein said PMOS transistor has a gate driven by a driving circuit which is arranged for providing at least a negative voltage, this negative voltage being low enough for turning on this PMOS transistor in response to a control signal provided by a logical unit of the electronic circuit in order to modulate.

2. The transponder according to claim 1, wherein said n-type well is connected to said ground.

3. The transponder according to claim 1, wherein the power supply of the electronic circuit generates a positive voltage Vdd, said driving circuit comprises an inverter followed by a high-pass filter formed by a series capacitor, connected to the gate of the PMOS transistor, and a parallel diode connected between this gate and the ground, this driving circuit further comprising a current source arranged between said positive voltage and the diode together with a switch controlled so that it turns off when the modulator is turned on.

4. The transponder according to claim 1, wherein said driving circuit further comprises an Anti-Negative Drift circuit arranged for verifying if the voltage at said gate of the PMOS transistor is above the ground level after a modulation cycle and, in the contrary case, for pulling the gate voltage at least to this ground level before a next modulation cycle.

5. The transponder according to claim 3, wherein said driving circuit further comprises an Anti-Negative Drift circuit arranged for verifying if the voltage at said gate of the PMOS transistor is above the ground level after a modulation cycle and, in the contrary case, for pulling the gate voltage at least to this ground level before a next modulation cycle.

* * * * *